United States Patent [19]

Owen et al.

[11] Patent Number: 5,360,981
[45] Date of Patent: Nov. 1, 1994

[54] AMORPHOUS SILICON MEMORY

[75] Inventors: Alan E. Owen, Edinburgh; Anthony J. Snell, Penicuik; Janos Hajto, Edinburgh; Peter G. Lecomber, Dundee; Mervyn J. Rose, Forfar, all of Scotland

[73] Assignee: British Telecommunications public limited company, London, England

[21] Appl. No.: 194,628

[22] PCT Filed: May 4, 1990

[86] PCT No.: PCT/GB90/00692

§ 371 Date: Sep. 25, 1991

§ 102(e) Date: Sep. 25, 1991

[87] PCT Pub. No.: WO90/13921

PCT Pub. Date: Nov. 15, 1990

Related U.S. Application Data

[63] Continuation of Ser. No. 761,907, Sep. 25, 1991, abandoned.

[30] Foreign Application Priority Data

May 11, 1989 [GB] United Kingdom ............... 8910854

[51] Int. Cl.$^5$ ............................................. H01L 45/00
[52] U.S. Cl. .......................................... 257/4; 437/172; 365/163
[58] Field of Search .................................. 257/2–5; 437/170, 171, 172; 365/163

[56] References Cited

U.S. PATENT DOCUMENTS

| | | | |
|---|---|---|---|
| 4,228,524 | 10/1980 | Neale et al. | 365/163 |
| 4,446,168 | 5/1984 | Kato et al. | 427/39 |
| 4,665,428 | 5/1987 | Hockley et al. | 257/2 |

FOREIGN PATENT DOCUMENTS

| | | |
|---|---|---|
| 0095283 | 11/1983 | European Pat. Off. . |
| 0115124 | 8/1984 | European Pat. Off. . |
| 0152689 | 8/1985 | European Pat. Off. . |
| 0162529 | 11/1985 | European Pat. Off. . |
| 2463508 | 2/1981 | France . |
| 2144911 | 3/1985 | United Kingdom . |
| 90/00817 | 1/1990 | WIPO . |

OTHER PUBLICATIONS

Applied Physics Letters, vol. 40, No. 9, 1 May 1982, New York US, pp. 812-813, den Boer: "Threshold switching in hydrogenated amorphous silicon".

Primary Examiner—William D. Larkins
Attorney, Agent, or Firm—Nixon & Vanderhye

[57] ABSTRACT

An analogue memory device comprises a layer of doped amorphous silicon located between a first conducting layer metal contact layer of V, Co, Ni, Pd, Fe or Mn. It has been found that the selection of one of these metals as the contact exerts a significant effect on the properties of the device, e.g. the selection of Al, Au or Cu gives no switching whereas Cr, W, Ag give digital instead of analogue switching.

11 Claims, 8 Drawing Sheets

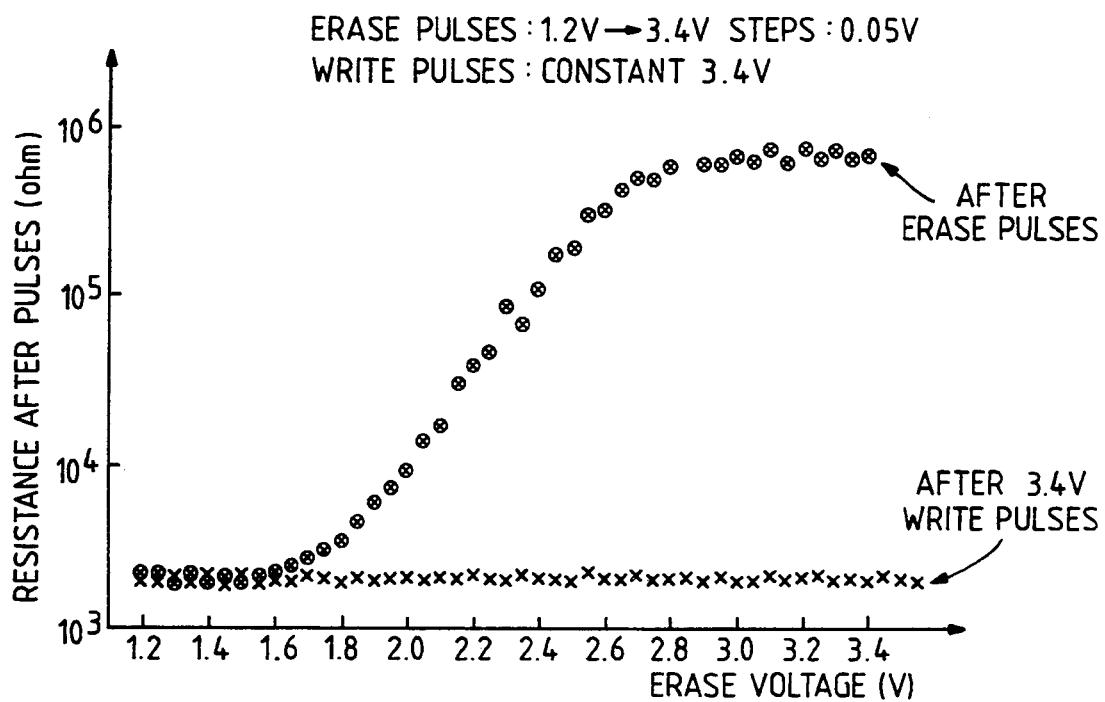
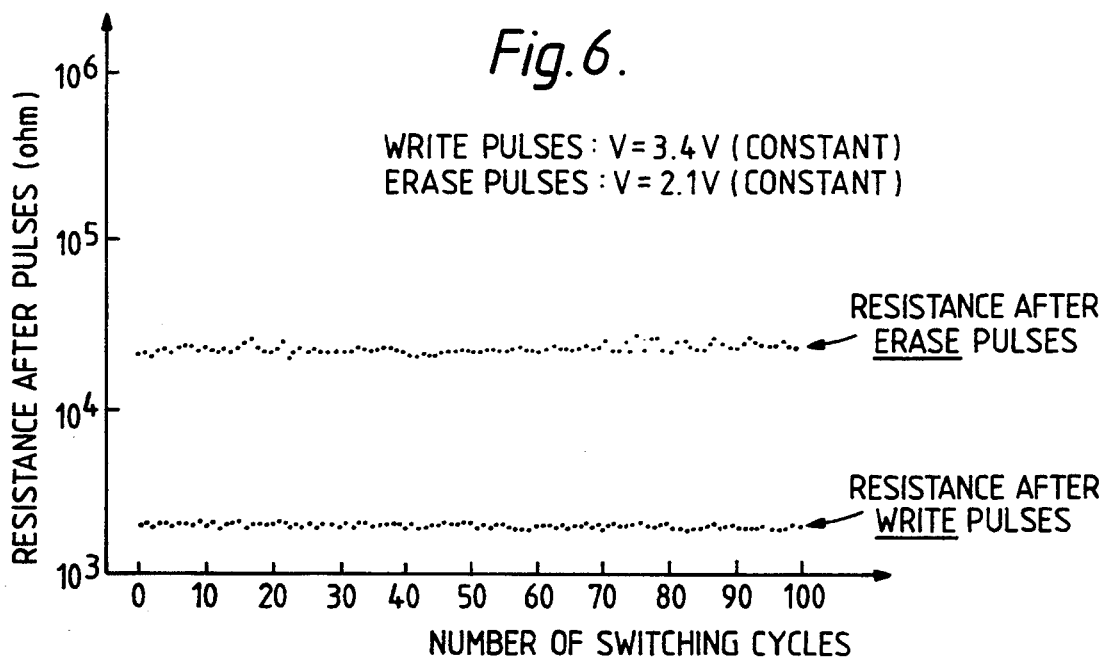

AMORPHOUS SILICON MEMORY

This is a continuation of application Ser. No. 07/761,907, filed Sep. 25, 1991, now abandoned.

The present invention relates to novel semiconductor devices capable of being set and reset to a plurality of different conductance states.

Most semiconductor devices are used in binary digital systems in which the device is in one of two states (e.g. a high and low resistance) which can be used to represent binary 0 and binary 1. However there is increasing interest in devices which can be in more than two states. Devices which can be set and reset into more than two conductance states (as opposed to the two states of digital devices) are potentially useful in structures known as neural networks which attempt to reproduce some of the arrangements of the human brain.

According to the present invention there is provided an analogue memory device capable of being set and reset into a resistance which is a measure of a voltage applied to it and which comprises
(a) a first conducting layer;
(b) a thin layer of a doped amorphous silicon above the first conducting layer;
(c) a metal top contact deposited on s aid amorphous silicon layer, the metal being one of V, Co, Ni, Pd, Fe or Mn; and
(d) the thin layer having been subjected to a voltage sufficiently high to convert it into an analogue memory device.

The nature of the first conducting layer is not critical as long as it is possible to grow the required amorphous silicon (a-Si) layer upon it. Examples of suitable materials are Cr or V. Examples of unsuitable materials are gold (which diffuses into the a-Si layer and mercury (which is liquid). The first conducting layer need not extend on the whole area of the amorphous silicon overlying it. Reference to the amorphous silicon layer being above the first conducting layer do not carry any implication about the orientation of the device in use but are intended to indicate only that the silicon is deposited after the first conducting layer.

The amorphous silicon must be dopable i.e. it must be possible to increase its conductivity by incorporating elements having higher or lower valency than silicon. Some techniques of depositing amorphous silicon may give silicon containing high levels of defects which cannot be doped e.g. Argon sputtering of a Si target in the absence silicon are well known to those skilled in the art. Thus low pressure plasma decomposition of silanes (optionally in the presence of hydrogen or fluorine onto a heated substrate may be used).

The deposition of amorphous silicon is discussed in W E Spear and P G LeComber, Topics in Applied Physics, Vol 55, (The Physics of Hydrogenated Amorphous silicon I) 1984 pages 65-71.

The amorphous silicon is doped. The silicon may be doped to produce n-type conductivity by incorporating an element with a higher valency e.g. P, or may be doped to give p-type conductivity as a result of introducing element of lower valency e.g.B.

The amorphous silicon is, preferably, doped so as to have a conductivity in the bulk state of at least $10^{-6}$ (ohms cm)$^{-1}$. The degree of doping is more preferably such as to correspond to p$^+$or n$^+$-silicon e.g. to conductivities greater than $10^{-4}$ (ohms cm)$^{-1}$.

Methods of producing doped amorphous silicon are well known to those skilled in the art. The silicon is preferably p$^+$silicon.

The thickness of the doped amorphous silicon is preferably in the range 200 Angstroms to 0.35 micrometers (20 to 350nm). The amorphous silicon layer may be pure hydrogenated amorphous silicon (apart from any doping) or may be a hydrogenated silicon alloy, e.g. a silicon germanium alloy.

The dopable silicon or silicon alloy may contain fluorine.

The identity of the top contact is important in obtaining analogue memory properties. In the production of semiconductor devices semiconductor layers are often deposited on a conducting substrate and a metal layer is deposited in a final step after the semiconductor layers have been deposited. This metal layer is the top contact of the device. The metal layer may, of course, be covered by encapsulating layers or by an additional metal layer which is used to obtain better contact with the metal layer in direct contact with he silicon. It is common in the semiconductor industry to stack devices one above the other in integrated circuits. It may be possible to stack other semiconducting and conducting layers above the device of the present invention to form other devices within a single integrated circuit.

Preferably the top contact metal is V, Co, Ni or Pd.

The metal may be deposited for example by thermal evaporation or by sputtering.

The thickness of the metal is not believed to be critical. Those skilled in the art will understand that the normal-requirements for producing metal contacts will imply certain limits. Thus there may be problems of electrical continuity if the layer is too thin and there may be problems of mechanical strain if the layer is too thick. The thickness of the layer may for example be 50 Angstroms (5nm) to 50 micrometers, preferably 100 Angstroms (10 nm) to 1 micrometer, more preferably 20 nm to 50 nm.

The device is a two terminal device. It is preferably in the form of a layer of amorphous silicon of a single conductivity type deposited on a conductive substrate as bottom contact. The nature of the bottom contact is not believed to be critical. Thus the bottom contact may be Cr even though Cr does not give useful analogue memory properties when used as a top contact.

The top contact is preferably in contact only with a relatively small area of the amorphous silicon layer for each device, as this allows large numbers of devices to be fabricated in a small area, so giving compact integrated circuits. A typical contact has an area of $10^{-6}$ cm$^2$. This can be readily achieved by the well-known process of photolithography.

A step of applying a voltage across the device to change the electrical characteristics is required. Such permanent electrical modification of semiconductor devices is often known as "forming" to those skilled in the art. The device as initially produced, before being subjected to the "forming" step has a relatively high resistance. Thus the resistance may be of the order of $10^9$ ohms.

For the preferred device containing only silicon of a single conductivity type references to forward or backward bias are meaningless and in principle it does not matter whether the top contact is positive or negative in relation to the bottom contact during the forming process.

Preferably, however, the top contact is positive in relation to the bottom contact during the forming process.

The forming step is preferably divided into two stages, a "soft" forming step and a "hard" forming step. The "hard" forming step is a step which converts the a-Si structure into a device having the desired and analogue memory properties. It is possible to "hard" form the device in a single step by applying a voltage which is sufficiently large to convert the structure to a memory device having a resistance less than the full OFF state. However, as indicated above, it is preferred to carry out a "soft" forming step initially. This involves applying a voltage which is sufficiently high (for example 13-14 volts) to permanently change the characteristics of the device and to reduce its resistance (for example, by two orders of magnitude) without transforming it to a device having analogue memory properties. The final "hard" forming step may be carried out by applying a further, slightly higher voltage (for example the order of 1 to 2 volts above the soft-forming voltage). Thus the initial "soft" forming events can be used to judge the voltage required for hard forming, resulting in a more controlled process. After "hard" forming the resistance of the analogue memory device will be lower than that of the "soft" formed structure (for example an order of magnitude or more lower). It will then be below the maximum resistance (the fully OFF stage) to which it can be reset in use.

The magnitude cf the forming voltage depends on the thickness of the amorphous silicon layer. It is preferably in the range 6 to 16 volts.

It is necessary to control the energy applied to the structure, as excessive energy can produce damage which prevents a satisfactory device being produced. The energy can be controlled by placing a resistance in circuit and by using short voltage pulses. Example of pulse lengths which may be used are 50 ns to 1 microsecond.

The devices of the present invention can be set and reset to a resistance which is a measure of an applied voltage. By "set" we mean that the device will retain this resistance even when the voltage which caused it to take this resistance has been removed. By "reset" we mean that the resistance can be changed to a new set value and is not permanently fixed in the original set value. The devices of the present invention are thus distinguished from threshold devices which only retain a given stage as long as a holding voltage is applied to them. They are different from the known binary memory devices in which the resistance may depend on the applied voltage but all voltages below a certain value correspond to one resistance and all voltages above another value correspond to another resistance. The devices of the present invention do not show analogue memory properties over the whole range of voltages which can be applied to them. It will be appreciated that a device which shows analogue memory properties over a voltage range of say 10 millivolts is not in practice a useful device. It is preferred therefore to select metal contacts which give analogue memory properties over a voltage range of at least 0.5V, and preferably over at least one V, more preferably over more than 2V.

The device after "forming" will normally be in a resistance state between the ON and OFF states. By applying a positive voltage pulse of sufficient voltage to the top contact, the device can be set into its highest (or OFF) resistance state. It can then be placed in a lower resistance state by making the bottom contact positive with respect to the top contact. If the voltage is sufficiently high the device will be switched to its minimum resistance (the fully ON state). Lesser voltages, providing they are within the appropriate voltage range will switch the device to an intermediate resistance which is related to the voltage applied.

An alternative method of setting the device is to apply a sufficient voltage to switch the "formed" device back to the fully ON state. It may then be switched to a lower resistance intermediate between the fully OFF and the full ON states, by the application of a positive voltage to the top contact.

The switching in the "formed" analogue memory device is preferably carried out with short voltage pulses for example pulses of length in the range 10 ns to 500 nsec.

The invention will now be described with reference to the accompanying drawings in which:

FIGS. 4 and 5 are graphical representation of the change in resistance of a formed device with changing ERASE voltage:

FIGS. 6 and 7 are graphical representations of the variation of resistance with number of constant voltage ERASE and WRITE pulses applied to a device according to the invention, the constant ERASE pulse being of a greater magnitude in FIG. 7 than in FIG. 6.

Figure 15:
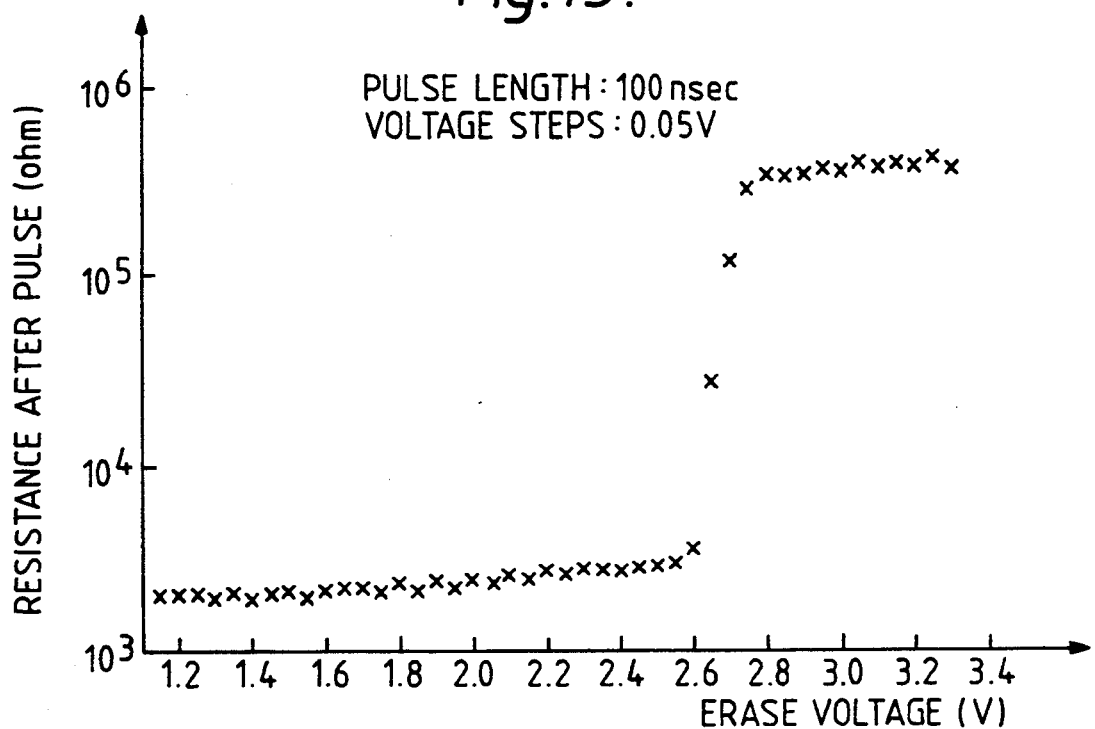
Figure 16:
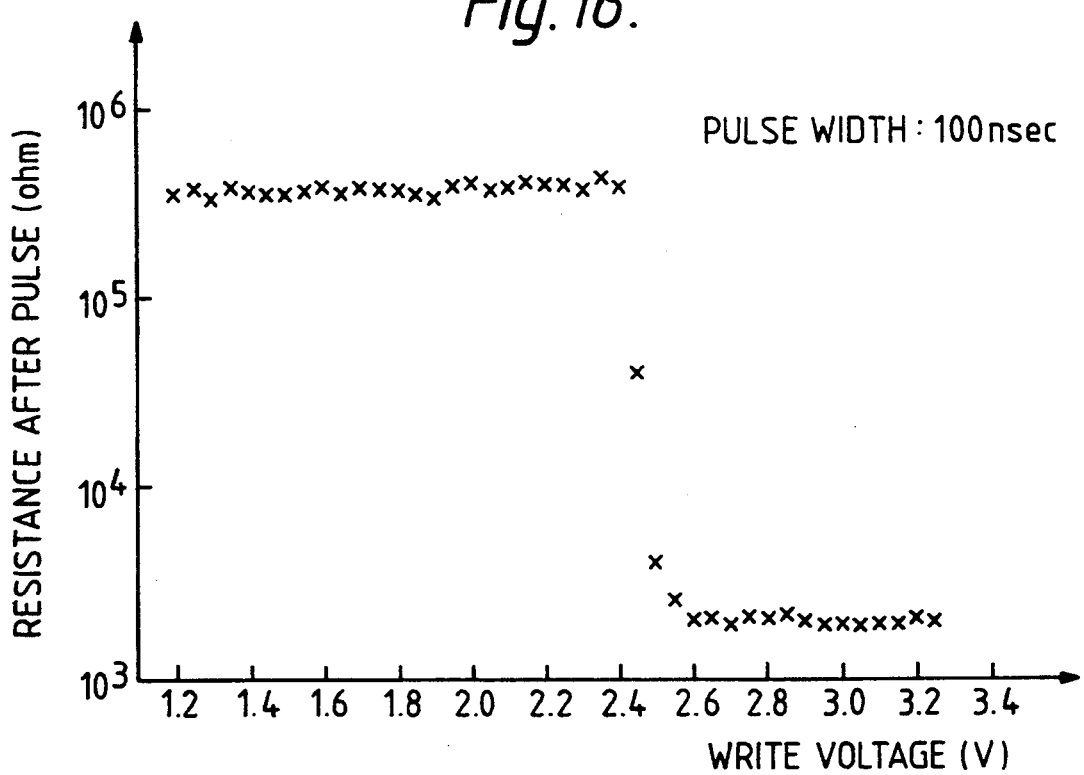

FIG. 15 is a graphical representation of the change in resistance of a device not according to the invention Which is initially in an ON state and is subjected to ERASE voltage pulses of increasing magnitude; and FIG. 16 is a graphical representation of the change in resistance of a device not according to the invention which is initially in the OFF state and which is subjected to WRITE Pulses of increasing magnitude.

It should be noted that in a digital device a WRITE pulse can be considered as one which sets the device to a state corresponding to either binary 0 or 1 while an ERASE pulse can be considered as a pulse which always resets the device to to an opposite state (binary 1 or 0). In the present specification a WRITE pulse is a pulse which tends to reduce the resistance of the device and an ERASE pulse is a pulse which tends to increase it. Thus a STORE Pulse which stores analogue information in the device about the magnitude of the voltage applied to it may be a WRITE or an ERASE pulse. A RESET Pulse which turns the device fully ON or OFF may thus be a WRITE or ERASE pulse provided it is of sufficient magnitude to change the device to the fully ON or OFF state.

EXAMPLE 1

A structure comprising a glass substrate, chromium first conducting layer, a layer cf hydrogenated amorphous silicon doped with doborane, ($B_2H_6$), and a top contact layer was fabricated as follows:

The glass structure was "Corning 7059" glass ("Corning" is a trademark) of thickness about 0.75 mm and length and width 45 mm and 20 mm respectively. A chromium layer of thickness about 150 nm was deposited on this substrate by standard thermal evaporation of chromium granules from an electrically heated tungsten filament in vacuum and subsequently patterned by conventional photolithography.

The amorphous silicon was deposited on this substrate in a single layer by the radio frequency glow discharge decomposition of a mixture of $SiN_4$ and about $10^4$ vppm of $B_2H_6$, obtained by admitting silane gas and a gas mixture of 5Δ doborane in hydrogen to the vacuum system via flow controllers. The glass substrate was mounted on a substrate holder contained within a vacuum pumped glass tube enclosure and heated to 310° C. (via a heater element contained within the substrate holder) at a vacuum of less than $10^{-6}$ torr. Nitrogen gas was then admitted to the system to raise the vacuum to 0.1 torr and a gas plasma discharge induced (as defined below) for a period of 4 minutes (power input 8W). The discharge was then extinguished, the $N_2$ flow stopped and the system pumped below $10^{-6}$ torr. The silane/doborane/hydrogen gases were then admitted to the chamber, flow conditions being set to achieve both silane/doborane ratio and a constant gas pressure of 0.1 torr, resulting from the balance of incoming gas flow and outgoing pumped gas. A gas plasma discharge was then induced using a radio frequency generator running at 40MHz and capacitively coupled to the gas via the substrate holder and tow external secondary electrodes 6cm away from the substrate. Power input from the generator was 8 watts corresponding to a power density of 20mW/cm² at the substrate. The RF discharge was maintained for 5.5 minutes and then extinguished. The resulting sample was cooled under vacuum and removed from the deposition system. The a-Si film resulting from this was measured to be 900 Angstrom thick ±50 Angstrom (90 nm ±5nm). The level of conductivity due to the $B_2H_6$ doping was measured to be between $10^{-3}$ and $10^{-2}$ (ohms.cm) $^{-1}$ in separate experiments using the same deposition conditions, corresponding to p+a-Si:H.

The amorphous silicon layer was then patterned using conventional lithography into a number of discrete elements of dimensions 900×500 micrometers, overlying regions of the chromium first conducting layer. An insulator layer was then provided over all but a very small area of the amorphous silicon, (itself overlying the first conducting layer), in order to define the area to be contacted by the final metal. This was done using a 1.2 micrometers thick insulator of photoresist (Shipley Microposit S1818) which was patterned, baked and cured at 200° to delineate the device area of $10^{-6}$ cm².

Figure 1:
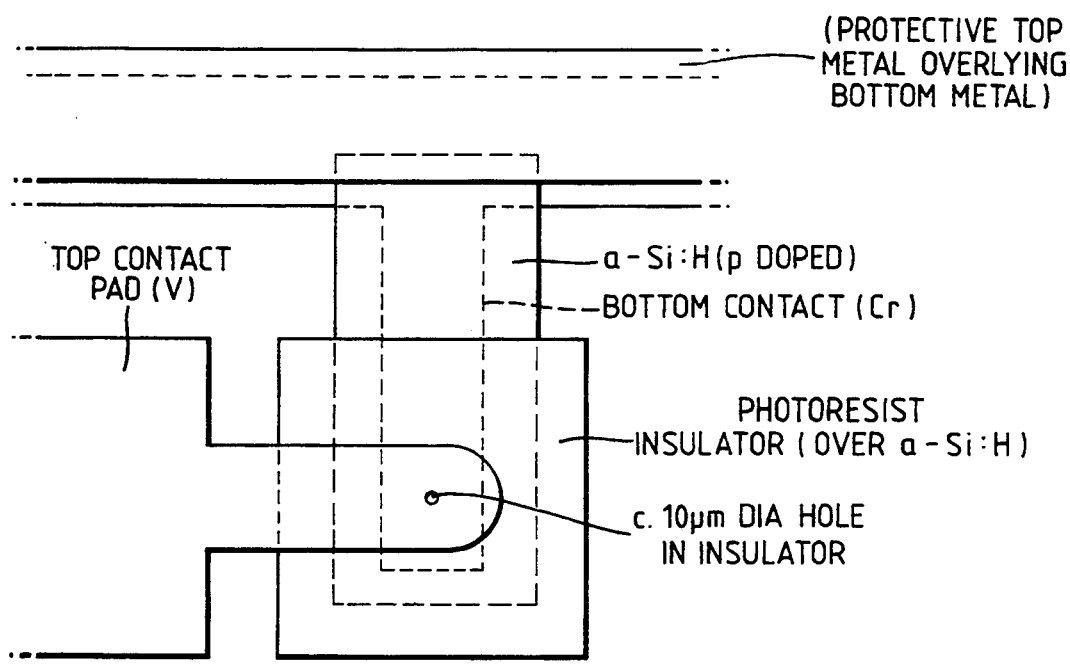
FIG. 1 is a plan view (not to scale) of a memory element in accordance with the present invention.

A top contact of vanadium was deposited over the device by the thermal evaporation of vanadium foil from an electrically heated tungsten filament in vacuum, to a thickness of 60 nm. This was patterned using conventional lithography techniques to provide individual contacts to each of the previously defined a-Si elements; this patterning also provided probing pads of the vanadium to one side of the devices, isolated from both chromium first layer and the a-Si layer except in the previously defined contact area. FIG. 1 shows a plan view of the device made by this technique The finished sample was designated 779/1. The electrical characteristics of an individual element on this sample were measured as follows.

Figure 2:
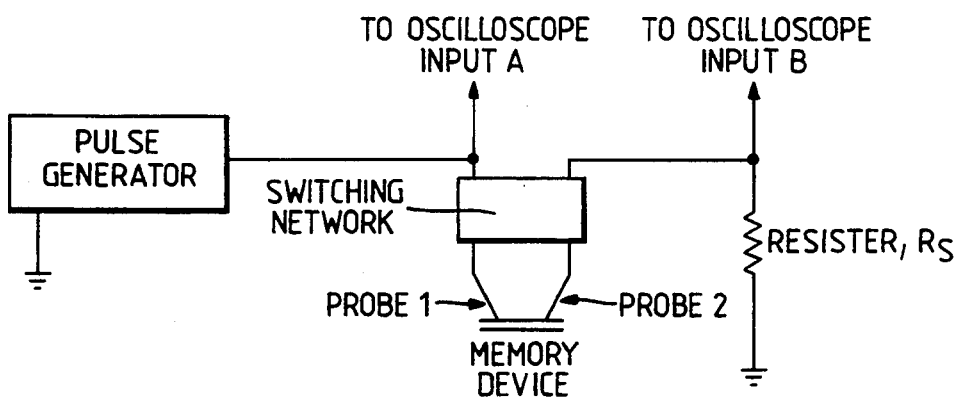
FIG. 2 is a diagrammatic representation of a circuit used in testing a memory element made in accordance with the invention.

The element was contacted using two electrical probe needles contacting the top and bottom metallisations. These probes were connected to a switching network, such that with the switch in either one of two positions one probe was connected to the pulse generator and the other probe was connected to one side of a resistor ($R_S$) and the input to an oscillioscope, the other side of the resistor being connected to earth. With the switch in the opposite position, these connections were reversed. The circuit is shown in FIG. 2. Hence, application of a voltage pulse to the device, using the pulse generator, induced a current in both the device and resistor $R_S$, thereby inducing a voltage proportional to this current at the oscillioscope .input. Measurement of this voltage allowed calculation of the device resistance. It will be appreciated that the value of $R_S$ needs to be sufficiently low to permit most of the applied voltage to appear across the device, yet large enough to give a detectable signal on the oscillioscope. Typically, $R_S$ values of from 1M ohms (for forming an initial informed measurement) and 100 ohms (for switching measurement) were used.

Figure 3:
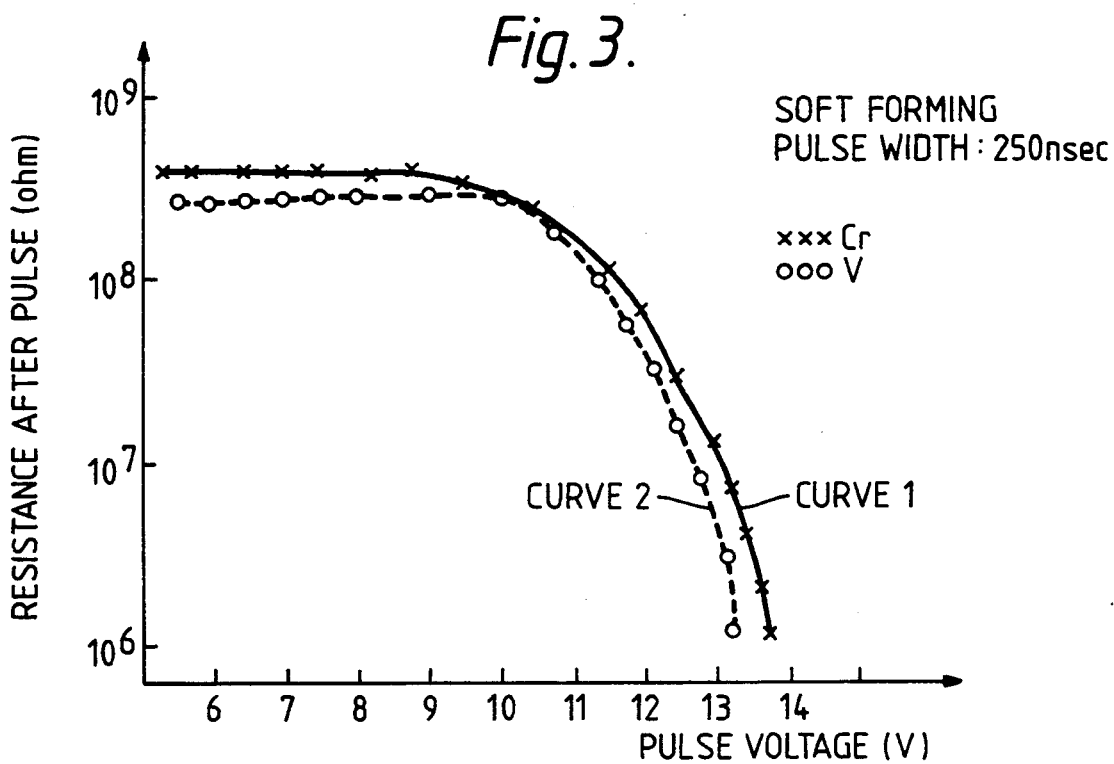
FIG. 3 is a graphical representation of the change in resistance during the forming process.

In order to measure device resistance, a low voltage of 0.5V was output from the pulse generator as continuous DC level; pulses for forming and switching were superimposed on this. Initially, the resistance of the element as made above was measured to be greater than $10^8$ ohms. The element was then subjected to a procedure in which its electrical properties were modified by the application of voltage pulses. A succession of 250 nsec. voltage pulses of progressively increasing voltage were applied across the a-Si film, with top (V) contact being at positive potential with respect to the first (Cr) contact. After each pulse the element resistance was determined as described above. FIG. 3 curve 1 shows the device resistance against previous voltage pulse as successive pulses are applied. (Note that the device resistance is stable until a further voltage pulse is applied and never returns to its original value once modified). At a voltage of between 13.5 and 14 volts, the resistance fell abruptly to a value of $7\times 10^5$ ohms, within the expected switching range of this element. It was then possible to obtain an even lower resistance in the device using far smaller negative voltage pulses (3.4V, 100 nsec), testifying to the permanent and dramatic change in device properties of the formed element that were then studied.

EXAMPLE 1(a)

Figure 4:
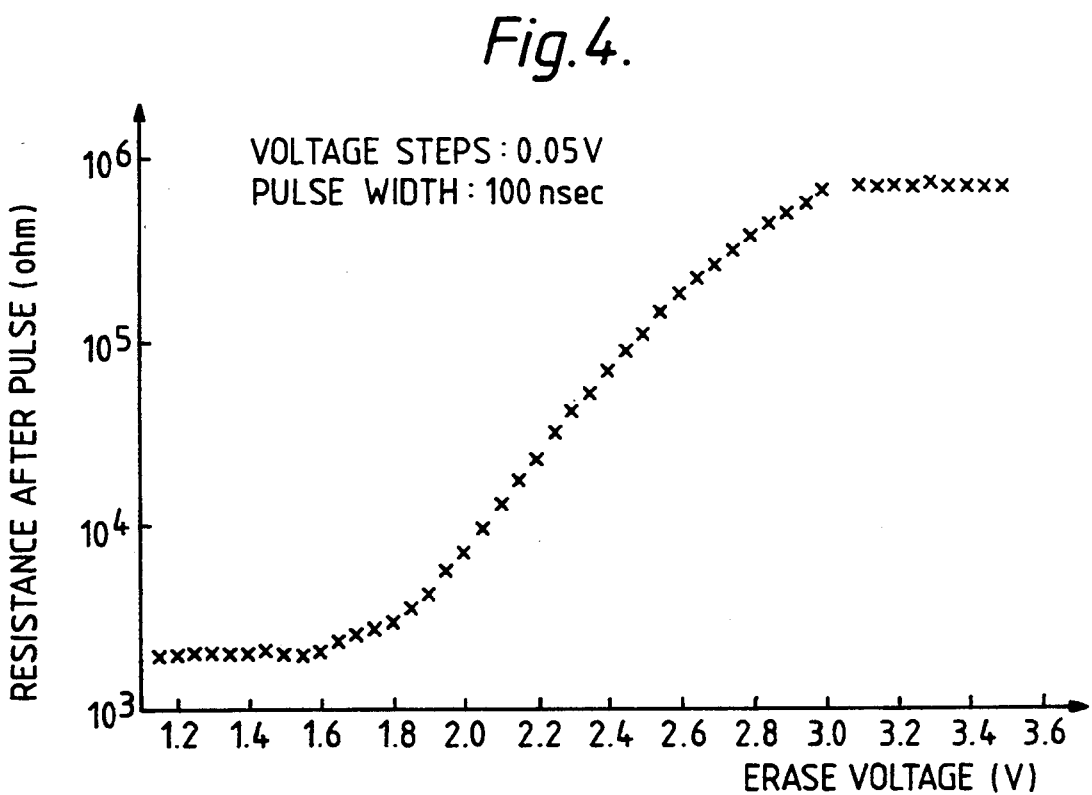

A positive pulse (100 nsec, 3.4V) was first applied to the element first contact (Cr), resulting in an ON state of $2\times 10^3$ ohms; (this is defined as a WRITE pulse). An opposite polarity pulse, positive to the top contact (V), (defined as an ERASE pulse), was then applied at successively higher voltages and the element resistance determined after each. The results of this test are shown in FIG. 4. It can be seen that at a threshold voltage of about 1.6V, the element resistance is gradually increased with each successively higher voltage until, at about 3.0V, a final resistance state of about $4\times 10^5$ ohms is achieved. It should be noted that all the states attained were non-volatile and stable, i.e. in the absence of any attempt to switch the element (e.g. with zero bias or when disconnected), it retained the conductivity state it had last been set to.

EXAMPLE 1(b)

Figure 7:
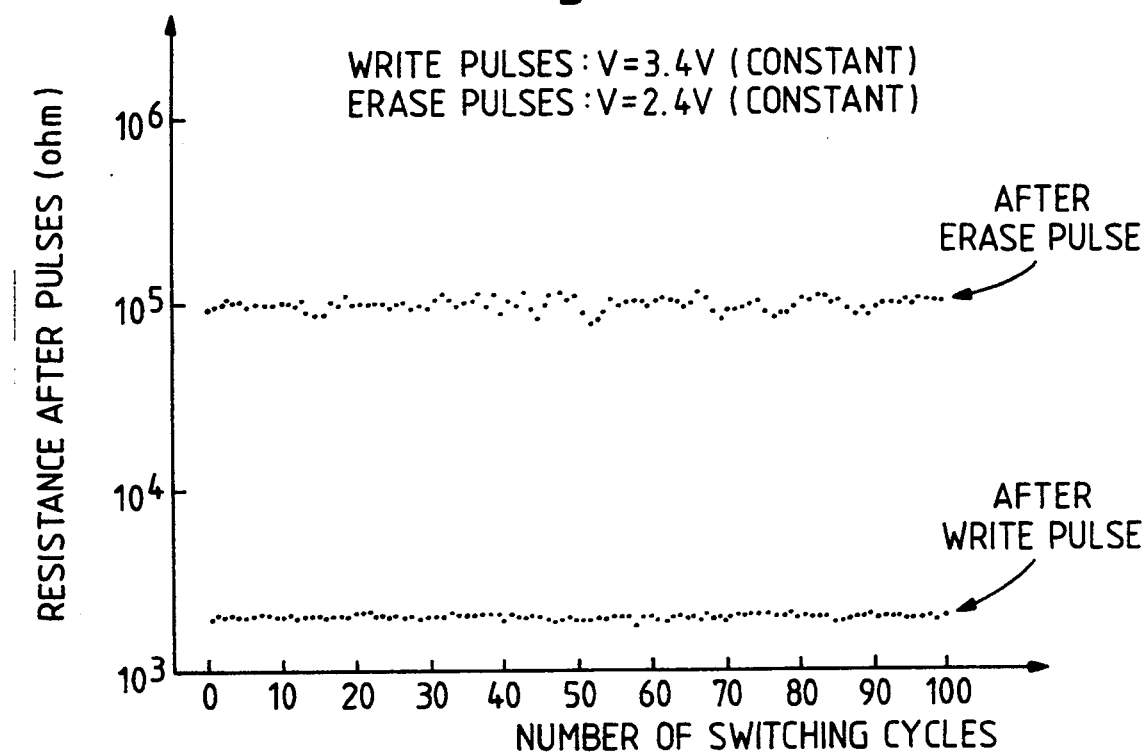

In order to fully demonstrate the voltage programmability of the device an alternative method of use was tested. In this example a positive, 100 nsec WRITE pulse of 3.4V was applied to the element first or bottom contact (Cr) to set the element to its low resistance state and the resistance measured ($2\times 10^3$) ohms; a positive, 100 nsec ERASE Pulse of, initially 1.2V was then applied to the element top contact (V) and the device resistance remeasured. This procedure was repeated with the ERASE pulse being increased by 0.05V on each successive occasion. The results of this test are shown in FIG. 5; as expected, the application of the WRITE Pulse resulted in a constant resistance value whilst increasing ERASE Pulse amplitude gave rise to a range of resistance values between $2\times 10^3$ ohms and $4\times 10^5$ ohms. This demonstrates that, between the upper and lower switching thresholds, the element resistance is primarily a function of applied voltage pulse, not of the number of pulses applied as might be deduced from FIG. 4. Thus the element can controllably be set on an intermediate resistance between an upper and lower bound. The reproducibility of the switching to these intermediate resistance states was tested by repeatedly applying fixed ERASE and WRITE Pulses of 100 nsec, 3.4 v and ERASE Pulses of 100 nsec 2.1V and 100 nsec 2.4V are shown in FIGS. 6 and 7 respectively. Over the duration of the test, the application of fixed pulses results in constant resistance values. (The scatter in the value after ERASE is to be expected due to small fluctuations in the value of applied voltage from the equipment; it is because of this that a wide voltage threshold range is desirable, in order to provide as many usable intermediate states as possible).

EXAMPLE 1(c)

Figure 8:
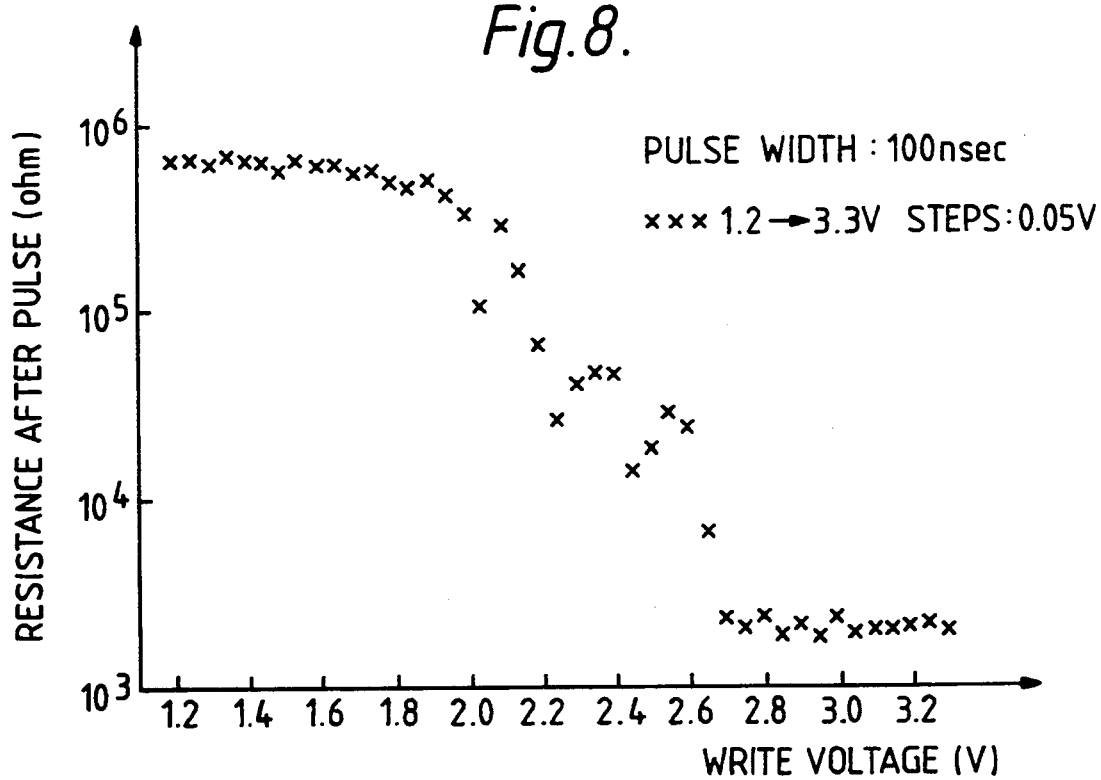
FIG. 8 is a graphical representation of the change in resistance of a device according to the invention as WRITE Pulses of increasing magnitude are applied to it.

A further method of using the element was tested. The element was first set to its high resistivity state ($8\times 10^5$ ohms) using an ERASE pulse of +3.4V, 100 nsec (applied to top contact (V)). A series of WRITE Pulses of 100 nsec duration were then applied to the element, starting at 1.2 V and incrementing each successive pulse of 0.05V up to 3.3V. The element resistance was measured after each pulse and the results are shown in FIG. 8. As before, intermediate resistance states are obtained for WRITE pulses between a lower threshold voltage and upper threshold voltage (of about 1.6V and 2.7V respectively), though there is far more scatter in the curve than for the case of incremental ERASE (FIG. 4).

EXAMPLE 1(d)

Figure 9:
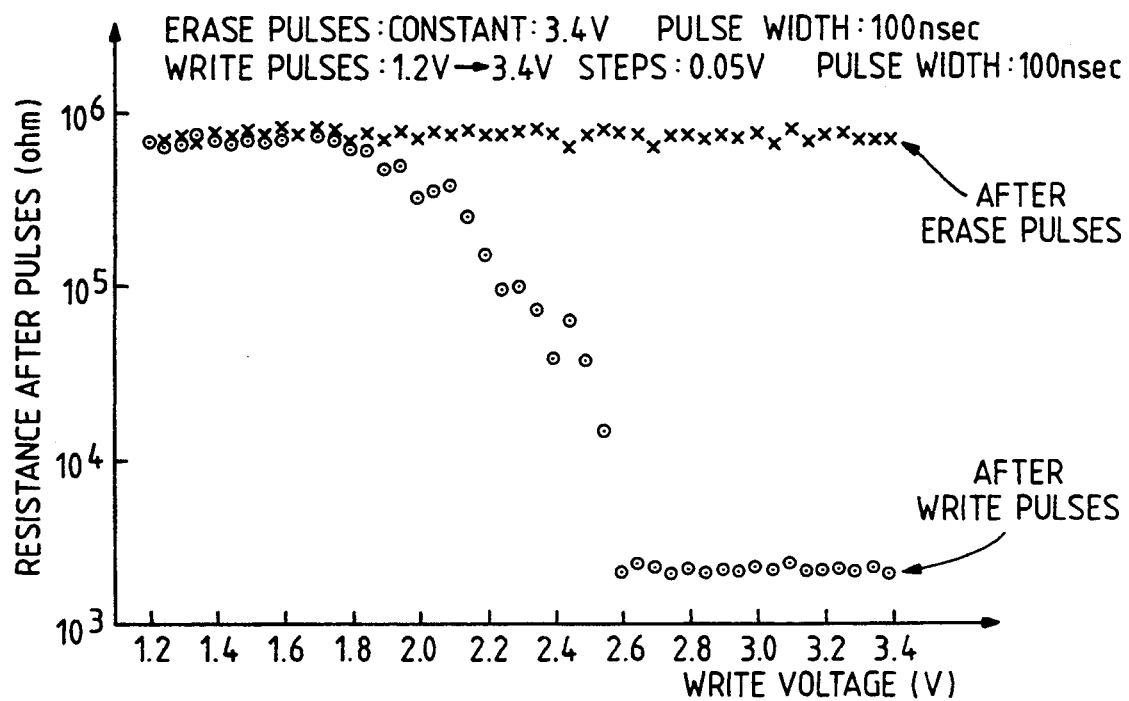
FIG. 9 is a graphical representation of the change in resistance of a device according to the invention alternatively subjected to an ERASE pulse of constant magnitude and a WRITE Pulse of increasing magnitude.

A further test was made in which a constant ERASE pulse of 3.4V, 100 nsec was applied to the element to reset it to its highest resistance state, followed by a WRITE Pulse of 100 nsec, voltage being incremented by 0.05V from 1.2V to 3.4V on successive repeats. Resistance was measured after each pulse and the results are shown in FIG. 9; as was the case for constant WRITE, incremental ERASE (FIG. 5), the intermediate resistance states are seen to be primarily a function of previously applied voltage pulse.

EXAMPLE 2

A sample was made as in Example 1, but with a first metal layer of 50 nm vanadium deposited by thermal evaporation as defined in Example 1. a-Si deposition was done simultaneously with Example 1 and the finished sample (V-p$^-$-V) designated 779/2.

An element of this sample was tested as in Example 1. Initially a series of 250 nsec positive voltage pulses were applied to the top contact, each successive pulse being of higher voltage than the last; element resistance was measured after each pulse. The test was stopped once the "forming" event was seen to take place (i.e. an abrupt change in resistance to $6\times 10^5$ ohms). The results of this test are shown in curve 2 in FIG. 3.

A further 4 experiments ((a)-(d) defined in Example 1) were then applied to the element to determine the dependence of the element resistance on previously applied voltage pulse.

Figure 10:
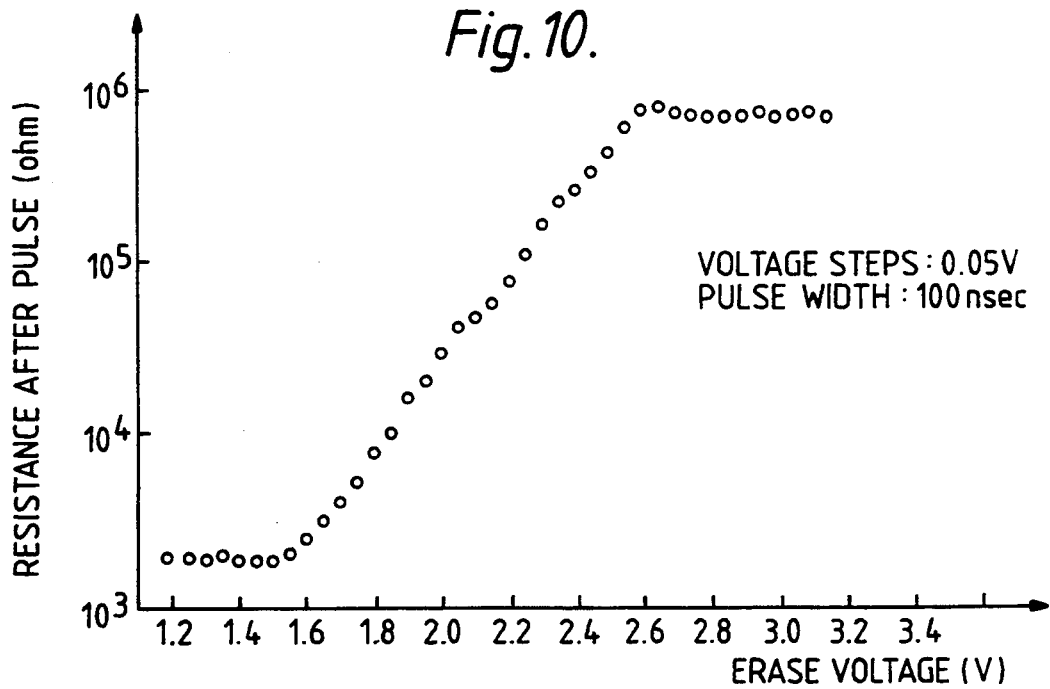
FIG. 10 is a graphical representation of the change in resistance of a device according to the invention initially in its ON stage and subjected to ERASE pulses of increasing magnitude.

FIG. 10 shows the results of experiment (a), (in which after initial WRITE Pulse (100 nsec, 3.4V to bottom contact), a sequence of 100 nsec ERASE pulses are applied from 1.2V to 3.2V in 0.05V steps).

Figure 11:
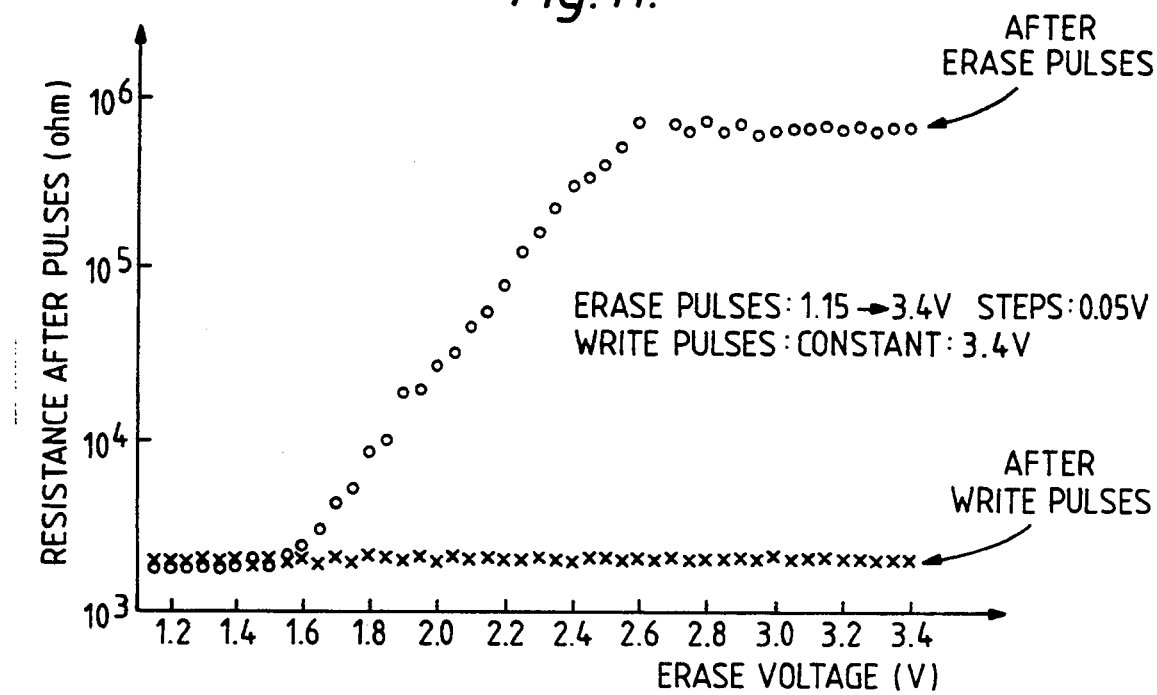
FIG. 11 is a graphical representation of the change in resistance of a device according to the invention which is initially in its ON stage and which is alternatively subjected to ERASE pulses of varying magnitude and WRITE Pulses of constant magnitude.

FIG. 11 shows the results of an experiment (b) (a sequence of alternating 3.4V, 100 nsec WRITE Pulses, each followed by an incremented 100 nsec ERASE pulse from experiment.

Figure 12:
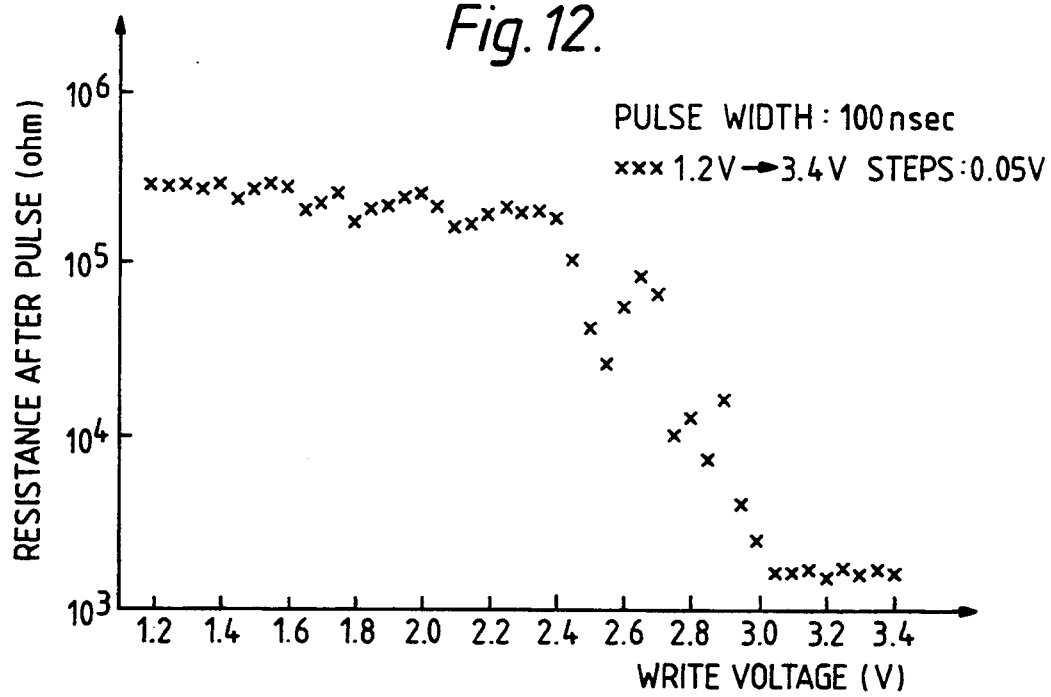
FIG. 12 is a graphical representation of the change in resistance of a device according to the invention which is initially in the OFF state and which is subjected to WRITE Pulses which increase in magnitude.

FIG. 12 shows the results from experiment (c) (initial ERASE pulse of 3.4 kV, 100 nsec, followed by incrementally increasing WRITE pulses of 100 nsec, 1.2V to 3.4V in 0.05V steps).

Figure 13:
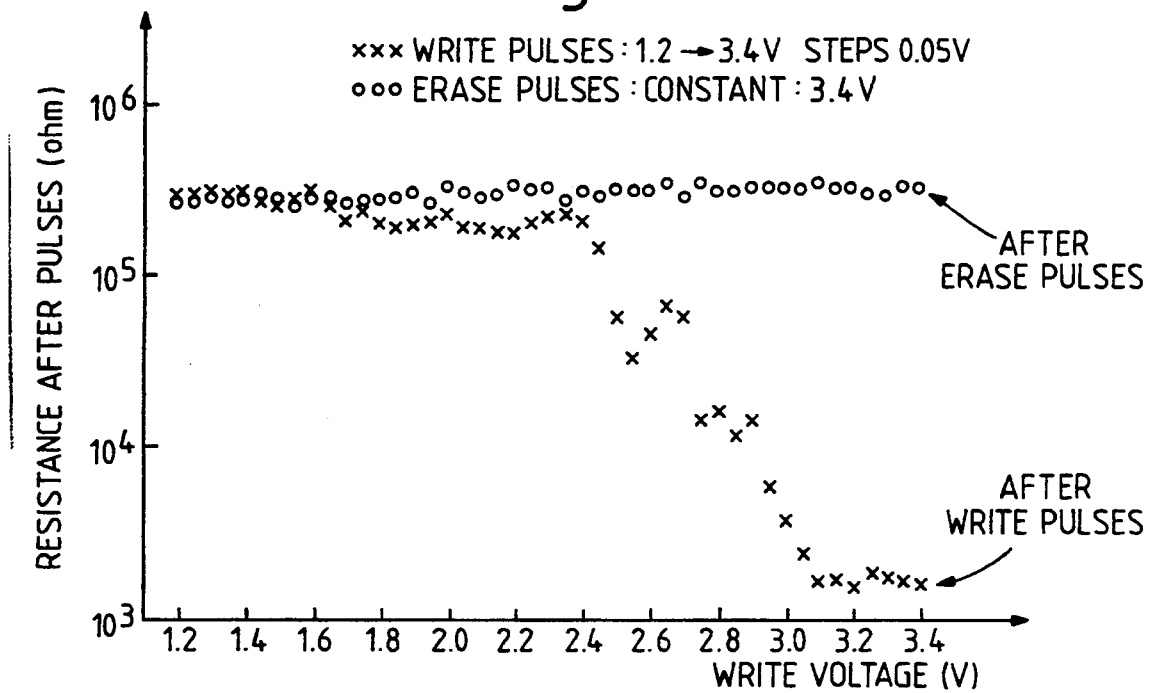
FIG. 13 is a graphical representation of the change in resistance of a device according to the invention subjected to alternatively WRITE and ERASE Pulses, with the ERASE Pulse held constant and the WRITE Pulse increasing in magnitude.

FIG. 13 shows the results from experiment (d) (alternative 3.4.V, 100 nsec ERASE Pulses followed by 100 nsec WRITE Pulses, incremented from 1.2V to 3.4V in 0.05V steps).

These tests show that the V-p$^+$-V sample behaves similarly to the V-p$^+$-Cr sample of Example 1; most importantly, there is no indication that replacing the first Cr metal layer with V induces further (opposite polarity) switching in the structure.

Comparative Test A

A sample was made as in Example 1, but with a final (top) metal layer of about 50 nm Cr, deposited as for the first bottom metal layer. a-Si deposition was done simultaneously with Example 1 and the finished sample (Cr-p+-Cr) designated 779/3.

Figure 14:
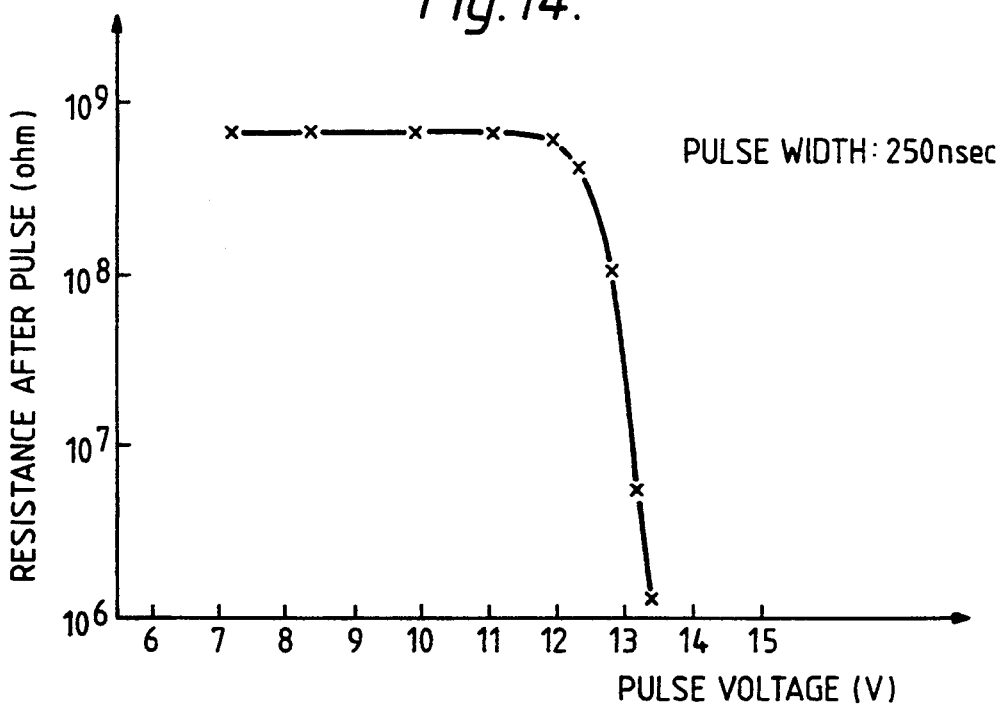
FIG. 14 is a graphical representation of the change in resistance of a device not according to the present invention which is initially in a high resistance state and which is subjected to voltage pulses of increasing magnitude, showing the rapid transition from a very high resistance state to a high resistance state when a critical voltage threshold is exceeded.

An element of this sample was tested as in Example 1. Initially a series of 250 nsec positive voltage pulses were applied to the top contact, each successive pulse being higher than the last, until the "forming" event took place. The results of this test are shown in FIG. 14; note that resistance changes take place over a much narrower voltage range than in the corresponding test on examples 1 and 2 (FIG. 3).

After "forming", the element was tested using method (a) and method (c) previously defined to determine the presence of intermediate resistance states.

FIG. 15 shows the results for method (1)

FIG. 16 the results for method (c). Note that although similar resistance limits are seen in this element compared to those of examples 1 and 2, (i.e. from $2 \times 10^3$ ohms to $3.5 \times 10^5$), and some intermediate states do exist, the voltage range over which these intermediate states can be obtained is far narrower than the range of examples 1 and 2. This makes it extremely difficult to obtain reliable programming of the intermediate states and the element is only suitable for digital use, (i.e. from the $2 \times 10^3$) ohms state to the $3.5 \times 10^5$ ohms state), and is corresponding classified as a digital device.

EXAMPLES 3–8 AND COMPARATIVE TESTS

A number of samples were made essentially as for example 1, (i.e. glass Cr first conducting layer, circa 900 Angstrom a-Si:H doped with $H_2H_6$), but a number of different top contact metal films were deposited in place of the V film of example 1. Each sample was then tested as in example 1 and the range of switching voltages over which intermediate states could be obtained was determined. Devices were accordingly classified as digital (switching ranges <0.5V) or analogue (switching range <0.5V); preferred analogue devices were defined as those exhibiting a switching range of 2.0V or more. Table 1 lists the results of this test.

TABLE 1

Survey of p+-switching with different top metals all the bottom contacts are chromium.
T.E. = thermal evaporation of top metal.
S = sputtered top metal.

| Example or test | Metal top contact | Method | Switching Type | Switching Range | Comments |
|---|---|---|---|---|---|
| B | Cr | T.E. | Digital | <0.5 V | Intermediate states exist |
| 3 | V | T.E. | Analogue | >2.0 V | Preferred |
| 4 | Fe | T.E. | Analogue | 0.5–1.0 V | — |
| 5 | Ni | T.E. | Analogue | 2.0 V | Preferred |
| C | Au | T.E. | No switching | — | — |
| D | Cu | T.E. | No switching | — | — |
| 6 | Co | T.E. | Analogue | >2.0 V | Preferred |
| E | Ti | T.E. | Unstable | — | — |
| F | Mo | S | Unstable | — | — |
| 7 | Pd | S | Analogue | 2.0 V | Preferred |
| G | W | S | Digital | — | — |
| 8 | Mn | — | Analogue | 0.5–1.0 V | — |
| H | Ag | — | Digital | <0.5 V | No intermediate states obtained |
| I | Al | — | No switching | — | — |

We claim:

1. An analog memory device capable of being set and reset to a resistance value over a continuous range of resistance values which is a measure of a voltage applied to it over a corresponding range of voltage values, said analog memory device comprising:
   a first conducting layer (a);
   a single thin layer (b) in direct electrical contact with layer (a);
   a metal top contact (c) in electrical contact with layer (b) without interposition of an intermediate conductive layer, the metal being one of V, Co, Ni, Pd, Fe or Mn;
   wherein layer (b) exhibits said range of resistance values and is located between layer (a) and layer (c), said layer (b) being formed by one of (i) pure or doped amorphous silicon, (ii) pure or doped amorphous hydrogenated silicon or (iii) a hydrogenated silicon alloy; and
   wherein layer (b) has been subjected to a voltage sufficiently high to convert it into an analog memory device exhibiting said range of settable resistance values.

2. An analog memory device as in claim 1, wherein layer (b) is formed of doped amorphous silicon.

3. An analog memory device as in claim 1, wherein the metal of the top contact is V, Co, Ni or Pd.

4. A method of making an analog memory device capable of being set and rest into a resistance over a continuous range of more than two resistance values which is a measure of a voltage applied to it over a corresponding range of voltage values, said method comprising the steps of:
   (i) depositing a first conducting layer (a) directly on an insulating substrate;
   (ii) depositing a thin layer (b) of one of (i) pure or doped amorphous silicon, (ii) pure or doped amorphous hydrogenated silicon or (iii) a hydrogenated silicon alloy on layer (a);
   (iii) depositing a contact layer (c) of V, Co, Ni, Pd, Fe or Mn on layer (b) without interposition of an intermediate conductive layer;
   (iv) applying a first forming voltage to the device, said voltage being sufficient to permanently reduce the resistance of the device; and
   (v) applying a second voltage to further reduce the resistance of the element.

5. A method as in claim 4 wherein the first forming voltage is 13–14 volts, the second forming voltage is 1–2 volts higher than the first forming voltage and layer (b) is 20–350 nm thick.

6. A neural network structure including a plurality of analog memory devices as in claim 1 wherein said neural network structure comprises an insulating substrate having deposited thereon a plurality of said analog memory devices wherein each layer (a) is in contact with said insulating substrate.

7. An analog memory device for use in a neural network as a variable resistance element that can be set and reset to any resistance within a continuous range of resistance values as a function of voltage applied thereto, said analog memory device comprising:
   a single layer of amorphous silicon grown directly over a first electrical contact layer;
   a second electrical contact layer of V, Co, Ni, Pd, Fe or Mn grown over said single layer of amorphous silicon without interposition of an intermediate conductive layer;

said single layer of amorphous silicon being altered after growth thereof by application of a forming voltage sufficient to convert this layer into a variable resistance element that can thereafter be reliably set and reset to retain any resistance within a continuous range of resistance values as a function of voltage applied thereto until subsequently again set or reset to a different value of resistance.

8. An analog memory device as in claim 7 wherein said amorphous silicon, except for dopant, is hydrogenated amorphous silicon.

9. An analog memory device as in claim 7 wherein said amorphous silicon is a hydrogenated silicon alloy.

10. An analog memory device as in claim 7 wherein said amorphous silicon is a silicon germanium alloy.

11. An analog memory device as in claim 7 wherein said amorphous silicon contains fluorine.

* * * * *